(12) United States Patent
Zojceski et al.

(10) Patent No.: US 10,337,713 B2
(45) Date of Patent: Jul. 2, 2019

(54) DEVICE FOR CONNECTING A LIGHT SOURCE TO AN ELECTRICAL POWER SUPPLY DEVICE

(71) Applicant: VALEO VISION, Bobigny (FR)

(72) Inventors: Zdravko Zojceski, Courbevoie (FR); Marc Duarte, Villemomble (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/548,911

(22) PCT Filed: Feb. 5, 2016

(86) PCT No.: PCT/EP2016/052570
§ 371 (c)(1),
(2) Date: Aug. 4, 2017

(87) PCT Pub. No.: WO2016/124776
PCT Pub. Date: Aug. 11, 2016

(65) Prior Publication Data
US 2018/0023792 A1 Jan. 25, 2018

(30) Foreign Application Priority Data

Feb. 5, 2015 (FR) ..................... 15 50887

(51) Int. Cl.
*F21S 41/19* (2018.01)
*F21V 23/06* (2006.01)
(Continued)

(52) U.S. Cl.
CPC ............ *F21V 23/06* (2013.01); *B60Q 1/0094* (2013.01); *F21S 41/141* (2018.01); *F21S 41/192* (2018.01);
(Continued)

(58) Field of Classification Search
None
See application file for complete search history.

(56) References Cited

U.S. PATENT DOCUMENTS 4,758,171 A * 7/1988 Hey ................... H01R 13/53
29/857
2007/0259576 A1 11/2007 Brandt et al.
(Continued)

FOREIGN PATENT DOCUMENTS

DE 10 2008 000 582 A1 9/2008
EP 1 853 096 A2 11/2007
(Continued)

OTHER PUBLICATIONS

International Search Report dated Apr. 19, 2016 in PCT/EP2016/052570 filed Feb. 5, 2016.
(Continued)

*Primary Examiner* — Xanthia C Cunningham
(74) *Attorney, Agent, or Firm* — Oblon, McClelland, Maier & Neustadt, L.L.P.

(57) ABSTRACT

The invention relates to a device for the electrical connection of at least one light source to an electric power supply device. The device is specifically employed in a lighting device for a motor vehicle, and permits the arrangement of light sources remotely from the connecting element which, in turn, can be arranged remotely from an electric power supply device of the light sources. The connecting device permits a high degree of freedom in the arrangement of light sources in relation to the device, as it casts little shadow upon the light sources, whilst ensuring the effective dissipation of heat generated thereby.

18 Claims, 1 Drawing Sheet

(51) Int. Cl.
*F21S 41/141* (2018.01)
*B60Q 1/00* (2006.01)
*F21V 23/00* (2015.01)
*H05K 1/11* (2006.01)
*F21V 29/508* (2015.01)
*F21V 29/71* (2015.01)
*H01R 4/02* (2006.01)
*H01R 4/18* (2006.01)
*H05K 7/20* (2006.01)
*F21S 45/47* (2018.01)
*H01L 33/62* (2010.01)
*H01L 33/48* (2010.01)
*H05K 1/02* (2006.01)
*F21Y 115/10* (2016.01)

(52) U.S. Cl.
CPC .......... *F21V 23/006* (2013.01); *F21V 29/508* (2015.01); *F21V 29/713* (2015.01); *H01R 4/023* (2013.01); *H01R 4/183* (2013.01); *H05K 1/117* (2013.01); *H05K 7/20409* (2013.01); *F21S 45/47* (2018.01); *F21Y 2115/10* (2016.08); *H01L 33/486* (2013.01); *H01L 33/62* (2013.01); *H05K 1/0209* (2013.01); *H05K 2201/066* (2013.01); *H05K 2201/10106* (2013.01); *H05K 2201/10287* (2013.01)

(56) References Cited

U.S. PATENT DOCUMENTS

| | | |
|---|---|---|
| 2008/0117647 A1 | 5/2008 | Behr et al. |
| 2008/0129204 A1 | 6/2008 | Tsukamoto et al. |
| 2008/0224166 A1 | 9/2008 | Glovatsky et al. |
| 2009/0139781 A1* | 6/2009 | Straubel .............. B60L 11/1875 180/65.1 |
| 2011/0103081 A1 | 5/2011 | Thullier et al. |
| 2011/0140136 A1 | 6/2011 | Daily et al. |
| 2013/0029539 A1* | 1/2013 | Frank .................... H01R 4/183 439/750 |
| 2013/0201707 A1 | 8/2013 | Suzuki et al. |
| 2014/0218954 A1 | 8/2014 | Yoon et al. |
| 2017/0047669 A1* | 2/2017 | Finona .................... H01R 4/20 |

FOREIGN PATENT DOCUMENTS

| | | | |
|---|---|---|---|
| EP | 1 923 626 A1 | 5/2008 | |
| EP | 1923626 A1 * | 5/2008 | .............. F21K 9/00 |
| EP | 2 306 599 A1 | 4/2011 | |
| EP | 2 333 407 A1 | 6/2011 | |
| EP | 2 623 850 A1 | 8/2013 | |
| JP | 2011-54473 A | 3/2011 | |
| WO | 98/09486 A1 | 3/1998 | |

OTHER PUBLICATIONS

French Search Report dated Dec. 18, 2015 in FR 1550887 filed Feb. 5, 2015.

* cited by examiner

DEVICE FOR CONNECTING A LIGHT SOURCE TO AN ELECTRICAL POWER SUPPLY DEVICE

The invention relates to the field of electric power supplies for light sources. Specifically, the invention relates to a system for connecting one or more light sources, more specifically light-emitting diodes, or LEDs, to an electric power supply device.

A light-emitting diode, or LED, is an electronic component which is capable of emitting light when an electric current flows therein. The luminous intensity emitted by a LED is generally dependent upon the intensity of the electric current passing through the latter. Inter alia, a LED is characterized by a threshold value for current intensity. This maximum forward current generally decreases as the temperature increases.

It is therefore important to manage the thermal behavior of such light sources, in order to ensure the operation thereof, and the emission of light at a constant intensity. This is particularly important in the field of lighting and/or signaling devices for motor vehicles, in which correct operation and the emission of light at a constant intensity constitute safety factors for the users of the vehicle which is equipped therewith. The use of LEDs is increasingly recommended in the field of motor vehicles, as LEDs permit the creation of particularly distinctive designs for lights, which are impossible to achieve using conventional light sources.

The connection of an electronic assembly comprising one or more LEDs to a remote electric power supply circuit, for example using an electrical connector harness, is known. In a known manner, the electric power supply circuit can convert an input voltage, delivered by a motor battery, into a load voltage which is appropriate for the supply of light sources. This remote connection permits the more flexible management of space for the installation of light sources, which is particularly important for the installation of LEDs in the restricted space available in a motor vehicle light.

It has likewise been proposed that the sub-assembly containing the light source(s) should be physically separated from the electronic assembly for the connection of the electric power supply device, which is typically housed in a rack. By this type of arrangement, the electronic assembly is not required to accommodate the substantial heat generated by light sources, particularly in the case of power LEDs. A known connection device of this type nevertheless incorporates dedicated thermal dissipation means for the evacuation of heat generated by the electronic circuit itself. These means typically comprise physically voluminous components, such as resistive circuits. There is a risk that these components will cast a shadow on the LEDs, thereby imposing a geometrical constraint upon the positioning of the sub-assembly which incorporates the LEDs, in relation to the connecting assembly. The appropriate dimensioning of such resistive circuits must, moreover, be adapted to each specific application intended, thereby rendering mass production problematic. Known electronic connecting assemblies require a dedicated electrical connection, which permits the connection thereof to an electric power supply device. Electrical connectors of this type require a dedicated socket in a standardized format. The height of the rack which accommodates the electronic assembly is therefore at least equal to the height of the seating for such a socket, thereby increasing the risk of a shadow being cast by the rack onto the LEDs which are connected thereto.

The object of the invention is therefore the proposal of a connecting device which rectifies at least one of the disadvantages of the prior art. A further object of the invention is the proposal of a lighting device which employs such a connecting device, and a light and/or signaling device for a motor vehicle which employs such a lighting device.

The object of the invention is a device for the electrical connection of at least one light source to an electric power supply device. The connecting device comprises a lead frame and first connecting means which are designed to connect the frame to a light source which is remote from the frame, by bridging. The connecting device is remarkable in that it further comprises second connecting means, which are designed to connect the frame to an electric power supply device, by crimping.

The device can preferably comprise mechanical connecting means, which are designed to connect the device to heat dissipation means.

The mechanical connecting means can preferably project from a first surface of a support element, wherein the lead frame is accommodated on a second surface of the support element, which is situated on the opposite side to the first surface. The support element can be configured with a generally planar geometry.

The mechanical connecting means can preferably comprise a thermally conductive material. The connecting means can advantageously comprise one or more arms, which extend orthogonally from the first surface, forming a pad at their respective ends. Each pad can comprise a clipping element, which is designed to engage with a corresponding structure in the heat dissipation means. The heat dissipation means can comprise, for example, a radiator having cooling fins, with which the clipping element can cooperate.

The second connecting means of the connecting device can preferably comprise at least one electrically conductive lug, which is designed to be crimped to a connecting element of an electric power supply device.

The second connecting means can advantageously comprise a row of a plurality of electrically conductive lugs, separated by electrically insulating elements.

The first connecting means can preferably comprise at least one connecting pad and at least one bridging wire. The bridging wire can advantageously be connected to the connecting pad by welding.

The lead frame of the connecting device can preferably comprise an electric circuit. Such a circuit can comprise a means of protection against electrostatic discharges (ESD), such as a capacitor, a means for the measurement of temperature, such as a thermistor, and a bin resistor which is designed to permit the electric power supply device to adapt to the luminous flux/current characteristic of each LED which is connected by means of the first connecting means.

A further object of the invention is a lighting device for a motor vehicle, comprising electric power supply means which are connected by means of an electrical connecting element to at least one light source which is remote from the connecting element. The lighting device is remarkable in that the connecting element is compliant with the connecting device according to the present invention. The electric power supply means are preferably connected to the connecting device by means of an electrical connector harness or power supply conductor bundle on the motor vehicle. The connecting device is thus advantageously devoid of an additional connector between the power supply conductor bundle and the connecting device on one side, and between the connecting device and the light sources on the other.

Preferably, the light source can be a light-emitting diode, or LED.

A further object of the invention is a lighting and/or signaling device for a motor vehicle. The lighting and/or signaling device is remarkable in that it comprises a lighting device according to the present invention.

The device according to the invention permits the connection of one or more light sources, specifically light-emitting diodes, or LEDs, to an electric power supply. The connecting device permits the remote connection of light sources on one side, and the electric power supply device on the other. Measures according to the invention permit the connecting device to have reduced dimensions in comparison with known connecting devices from the prior art. As the connection to an electric power supply device is effected by crimping, the dimensions of the connecting device are reduced in comparison with a device requiring a seating for a socket of a standard connector. This reduction permits the arrangement of the sub-assembly comprising the LEDs, which is formed by bridging (or "wire-bonding") in proximity to the connecting device. This is not possible using known connecting devices, as the height thereof in relation to the height of the sub-assembly of LEDs is such that the known devices cast a shadow on the LEDs, thereby limiting their utility. Mechanical means which are suitable for connecting the device to a radiator permit the omission of a resistive circuit on the lead frame. The absence of a resistive circuit on the lead frame of the device firstly permits a reduction in the dimensions of the device, thereby assisting in the reduction of the shadow effect described above, and secondly permits the mass production of the connector according to the invention, which can be employed in various applications.

Further characteristics and advantages of the present invention will be clarified by the description of exemplary embodiments of the invention and the drawings, wherein.

In the following description, terms which describe the position and the dimensions of certain elements, such as "on", "under", "height", etc. refer to the specific arrangements illustrated in the figures. However, these terms must be interpreted in a relative manner, rather than in a strict and absolute manner. In practice, the devices described herein can be oriented differently, without departing from the invention in any respect.

Unless explicitly indicated otherwise, the technical characteristics described with respect to a given form of embodiment of the invention can be combined with technical characteristics described with respect to other forms of embodiment, without departing from the invention. The separation of such characteristics is provided solely in the interests of improving the clarity of the description.

Similar reference numbers are employed to describe similar characteristics of the invention in separate forms of embodiment. For example, the numbers 100 and 200 are used to describe the electrical connecting device according to the invention in two separate forms of embodiment.

Figure 1:
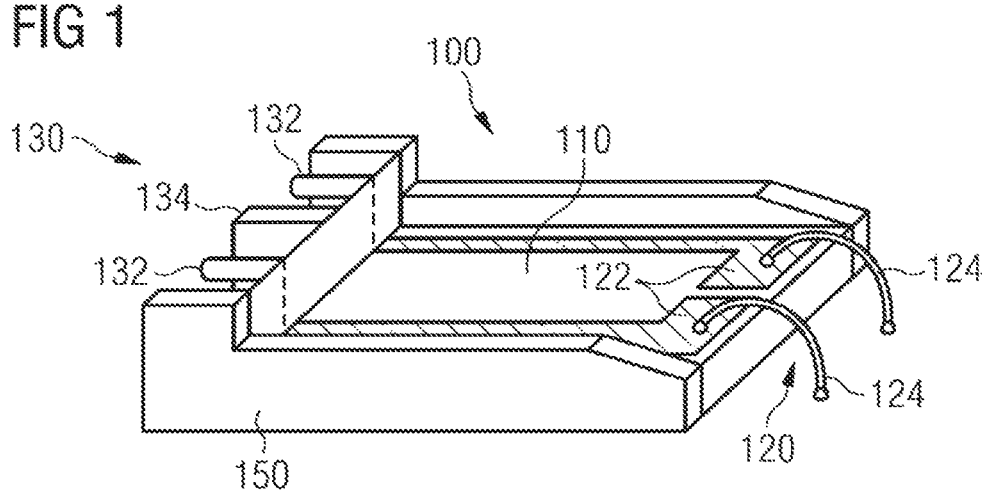
FIG. 1 shows a perspective illustration of a preferred form of embodiment of the device according to the invention.

FIG. 1 shows an illustration of a preferred form of embodiment of the connecting device according to the invention. The device 100 comprises a lead frame 110. A lead frame is a structure of conductive tracks in a one-piece configuration. This lead frame can, for example, be die-stamped from sheet metal for the formation of conductive tracks, and thereafter overmolded on an insulating substrate, the parts of which other than those forming the tracks are separated from the sheet metal after overmolding. The first connecting means 120 are suitable for connecting the frame 110 to a sub-assembly comprising one or more light sources. By way of a non-limiting example, the light sources are hereinafter considered to be light-emitting diodes, or LEDs. The first connecting means 120 comprise a connecting pad 122, which is designed to permit connection to the LED by the application of the technique of wire-bonding 124. This connection is executed by bridging. Bridging techniques per se are well known from the prior art. In this manner, LEDs are electrically connected to the lead frame 110, whilst being remotely arranged and removed from the latter, thereby advantageously permitting the simplification of the structure of the lead frame. The device 100 also comprises second connecting means 130, which are designed to connect the lead frame 110 to an electric power supply device by crimping. To this end, the connecting means 130 comprise electrically conductive lugs 132, which permit the crimping of a first end of the conductor wires on a connector harness, the second end of which is connected to an electric power supply device which is known per se from the prior art. Tools for the execution of this crimped lug connection are known per se from the prior art, and will not be described in greater detail in the context of the present invention. The use of lugs 132 permits the reduction of the space provided for connecting means on the device 100. Specifically, the device 100, with reference to FIG. 1, can have a relatively low height by means of this measure. This has an advantage, in that a sub-assembly which is connected by means of the connecting means 120 will not be shadowed, or only shadowed to a limited extent by the device 100.

The frame 110 can advantageously be accommodated on a support 150 which, in a preferred form of embodiment, can constitute a rack of the device 100, as illustrated in FIG. 1. The rack illustrated defines an essentially planar surface, upon which the frame 110 is accommodated. It also comprises walls, which flank the sides of the surface. The surface is illustrated as rectangular, but can also assume a different geometry, without departing from the scope of the invention. Likewise, the first 120 and second 130 connecting means are illustrated as being arranged at opposing ends of the surface of the support 150, although other arrangements are conceivable, without departing from the scope of the invention. The rack or support element 150 can preferably be formed by the molding of a synthetic material such as, for example, polypropylene, or PP. Advantageously, the support element comprises one or more electrically insulating separator elements 134, which permit the separation of the lugs 132, in the interests of facilitating the crimping operation. As indicated in FIG. 1, the separator elements 134 can be formed, for example, by walls which are perpendicular to the plane of the lead frame 110, and arranged between the lugs 132. Other geometries will be known to a person skilled in the art, who will be able to adapt the configuration described to the constraints associated with specific applications.

In addition to the configuration illustrated in FIG. 1, the lead frame can incorporate an electronic assembly, comprising resistors, capacitors, thermistors or other components, according to the functionality deployed by the assembly. The components of the assembly are ideally secured by the technique of laser welding.

Figure 2:
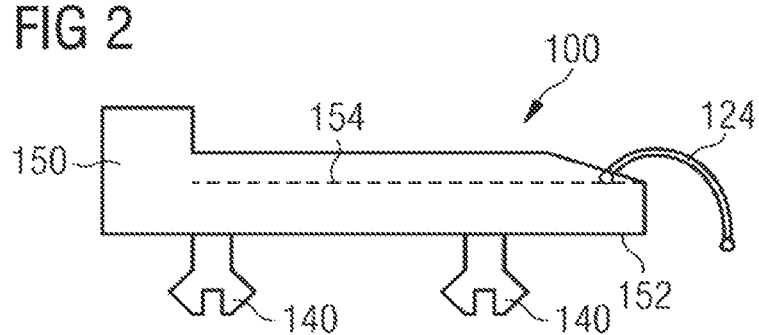
FIG. 2 shows an illustration, in lateral cross section, of a preferred form of embodiment of the device according to the invention.

FIG. 2 illustrates the device 100 in lateral cross section. The support element 150 can be seen herein, which defines two opposing planar surfaces 152 and 154. The frame 110 is accommodated on the surface 154. The surface 152 comprises connecting means, which permit the connection of the device 100 to a thermal dissipation device, such as a radiator arranged below the device 100, which permits the evacuation of heat generated by the device 100. In the form of embodiment illustrated, the connecting means 140 comprise arms which extend perpendicularly to the surface 152. The ends of the arms are provided with clipping elements or claws, which are configured to engage, for example, between the cooling fins of a radiator device. The arms 140 are preferably formed of a thermally conductive material, and are connected to the frame 110. This is achieved, for example, by means of holes in the plane defined by the element 150, which are suitable for conducting the heat generated by the frame 110 to the arms 140, where it is dissipated by a radiator device. The exact geometry of the claws can vary, without departing from the scope of the invention. A person skilled in the art will be able to adapt the connecting means 140, such that the latter will be able to cooperate with specific dissipation devices which are known per se from the prior art.

Alternatively, the surface 152 can comprise thermal links to the frame 110, arranged on the surface itself. A layer of thermally conductive adhesive can then be used to connect the surface 152 to a thermal dissipation element having an essentially planar connecting surface.

The measures described permit the omission of a resistive circuit on the lead frame 110, of the type which is customarily employed in devices which are known from the prior art, the sole purpose of which is the dissipation of heat generated by the frame. The components of such circuits are generally voluminous, and increase the geometrical dimensions of the device 100. The employment of connecting and thermal dissipation means 140 thus permits the further reduction of the dimensions of the device, whilst ensuring the requisite thermal dissipation for the correct operation of the lead frame 110. The reduction of dimensions further reduces the risk of a shadow being cast on a sub-assembly which is connected to the device and comprises LEDs.

Figure 3:
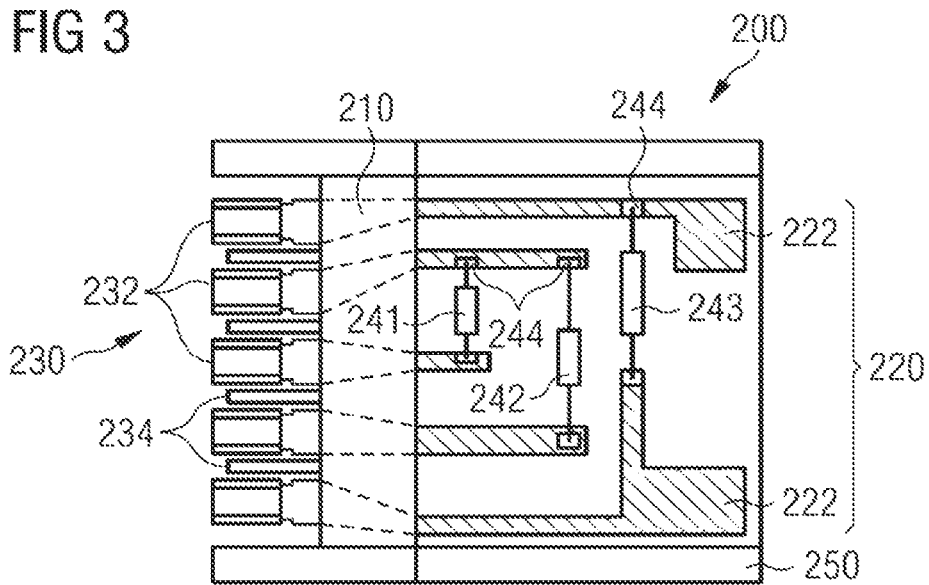
FIG. 3 shows an illustration, in overhead view, of a preferred form of embodiment of the device according to the invention.

FIG. 3 shows a schematic illustration of an overhead view of a preferred form of embodiment 200 of the device 200 according to the invention. The device 200 is substantially similar to the device 100 described heretofore, and comprises a lead frame 210 which is similar to that described in the preceding forms of embodiment. First connecting means 220 are designed to connect the frame 210 to a sub-assembly comprising one or more light sources. The first connecting means 220 comprise a connecting pad 222, which is designed to permit connection to the LED by the application of the technique of wire-bonding. This connection is executed by bridging. The device 200 also comprises second connecting means 230, which are designed to connect the lead frame 210 to an electric power supply device by crimping. To this end, the connecting means 230 comprise electrically conductive lugs 232, which permit the crimping of a first end of the conductor wires on a connector harness, the second end of which is connected to an electric power supply device which is known per se from the prior art.

The frame 210 can advantageously be accommodated on a support 250 which, in a preferred form of embodiment, can constitute a rack of the device 200. Advantageously, the support element comprises one or more electrically insulating separator elements 234, which permit the separation of the lugs 232, in the interests of facilitating the crimping operation. As indicated in FIG. 3, the separator elements 234 can be formed, for example, by walls which are perpendicular to the plane of the lead frame 210, and arranged between the lugs 232.

As illustrated in FIG. 3, the lead frame can advantageously incorporate an electronic assembly, comprising resistors, capacitors, thermistors or other components, according to the functionality deployed by the assembly. The assembly illustrated comprises a means of protection against electrostatic discharges, or ESDs, configured, for example, in the form of a capacitor 243. It can also comprise a means for the measurement of temperature such as, for example, a thermistor 242 and a bin resistor 241, which is designed to permit the electric power supply device, connected by crimping, to adapt to the luminous flux/current characteristic of each LED which is connected by means of the first connecting means 220. The components of the assembly are ideally secured by laser welds 244.

Measures according to the invention render the connector particularly appropriate for the construction of a lighting device for a motor vehicle. Lights feature restricted spaces. The connecting device according to the invention has reduced dimensions, in comparison with known connecting devices from the prior art, which is an advantage per se in the present context. Moreover, as the device according to the invention reduces the risk of a shadow being cast on the sub-assembly which incorporates the light sources, it provides greater freedom in the positioning of light sources in such a lighting device, by eliminating certain constraints on positioning which are known from the prior art. Specifically, a lighting device which employs the connecting device according to the invention can be applied in a lighting and/or signaling device of a motor vehicle.

The invention claimed is:

1. A connecting device for the electrical connection of at least one light source to an electric power supply device, wherein the connecting device comprises:
    a lead frame, a first connector to bridge the frame to the at least one light source which is remote from the frame, and the connecting device further comprises a second connector to crimp the frame to the electric power supply device, wherein the connecting device has a substantially planar surface and the first connector and the second connector are disposed on opposing ends of the substantially planar surface of the connecting device, and the second connector comprises a row of a plurality of electrically conductive lugs to crimp to a connecting element of the electric power supply device, separated by electrically insulating elements of the lead frame.

2. The connecting device according to claim 1, further comprises a mechanical connector to connect the connecting device to a heat dissipation mechanism.

3. The connecting device according to claim 2, wherein the mechanical connector projects from a first surface of a support element, wherein the lead frame is accommodated on a second surface of the support element, which is situated on the opposite side to the first surface.

4. The connecting device according to claim 3, wherein the mechanical connector comprises a thermally conductive material.

5. The connecting device according to claim 3, wherein the second connector comprises at least one electrically-conductive lug to crimp to a connecting element of the electric power supply device.

6. The connecting device according to claim 3, wherein the first connector comprises at least one connecting pad and at least one bridging wire.

7. The connecting device according to claim 2, wherein the mechanical connector comprises a thermally conductive material.

8. The connecting device according to claim 2, wherein the second connector comprises at least one electrically-conductive lug to crimp to a connecting element of the electric power supply device.

9. The connecting device according to claim 2, wherein the first connector comprises at least one connecting pad and at least one bridging wire.

10. The connecting device according to claim 2, wherein the lead frame comprises an electric circuit.

11. A lighting device for a motor vehicle comprising an electric power supply connected by an electrical connecting element to at least one light source which is remote from the connecting element, wherein the connecting element includes the connecting device according to claim 2.

12. The connecting device according to claim 1, wherein the first connector comprises at least one connecting pad and at least one bridging wire.

13. The connecting device according to claim 12, wherein the bridging wire is welded to the connecting pad.

14. The connecting device according to claim 1, wherein the lead frame comprises an electric circuit.

15. A lighting device for a motor vehicle comprising an electric power supply connected by an electrical connecting element to at least one light source which is remote from the electrical connecting element, wherein the electrical connecting element includes the connecting device according to claim 1.

16. The lighting device according to claim 15, wherein the at least one light source is a light-emitting diode, or LED.

17. A lighting and/or signaling device for a motor vehicle, wherein the lighting and/or signaling device comprises a lighting device according to claim 16.

18. A lighting and/or signaling device for a motor vehicle, wherein the lighting and/or signaling device comprises a lighting device according to claim 15.

* * * * *